United States Patent [19]
Waggoner et al.

[11] Patent Number: 5,532,630
[45] Date of Patent: Jul. 2, 1996

[54] RECEIVER CIRCUIT WITH A BUS-KEEPER FEATURE

[75] Inventors: Charles D. Waggoner, Richardson; Richard J. Blumberg, Plano; Gary B. Kotzur, Spring, all of Tex.

[73] Assignee: SGS-Thomson Microelectronics, Inc., Carrollton, Tex.

[21] Appl. No.: 281,509

[22] Filed: Jul. 27, 1994

Related U.S. Application Data

[63] Continuation of Ser. No. 879,191, May 6, 1992, abandoned.

[51] Int. Cl.[6] .......................... H03K 3/00; H03K 17/16
[52] U.S. Cl. ..................... 327/108; 327/112; 327/379; 327/387; 327/391; 327/427; 326/21; 326/30
[58] Field of Search ........................ 307/451, 475, 307/571, 573, 576, 473, 579, 585, 270, 352; 327/108, 112, 379, 387, 389, 391; 326/21, 24, 30, 56, 57, 58, 62, 86, 90, 91

[56] References Cited

U.S. PATENT DOCUMENTS

| | | | |
|---|---|---|---|
| 4,656,429 | 4/1987 | Masuda et al. | 307/352 |
| 4,988,893 | 1/1991 | Bonneau et al. | 307/585 |
| 5,001,367 | 3/1991 | Vinal | 307/451 |
| 5,025,182 | 6/1991 | Farmer | 307/451 |
| 5,027,008 | 6/1991 | Runaldue | 307/475 |
| 5,117,131 | 5/1992 | Ochi et al. | 307/451 |
| 5,122,691 | 6/1992 | Balakrishnan | 326/62 |

*Primary Examiner*—David C. Nelms
*Assistant Examiner*—Trong Phan
*Attorney, Agent, or Firm*—Rodney M. Anderson; Lisa K. Jorgenson

[57] ABSTRACT

A bidirectional input/output buffer is disclosed, where the receiver includes complementary bus keeper transistors. The keeper transistors are of opposite conductivity types, and have their gates coupled to the output of a receiver inverter. The keeper transistors thus reinforce the driven data state at the input of the receiver, in CMOS latch fashion, and hold the prior data state thereon after the driving output driver is in tristate. The keeper transistors have significantly weaker drive characteristics than the other receiver transistors, and than typical output drivers, so that the keeper transistors can be easily overdriven with the next data state, if different. In addition, the source/drain resistance of the keeper transistors is also preferably quite high, so that the power dissipation on switching is relatively low. These characteristics are readily achievable by providing relatively long channel lengths for the keeper transistors, relative to other transistors in the circuit.

20 Claims, 4 Drawing Sheets

RECEIVER CIRCUIT WITH A BUS-KEEPER FEATURE

The present application is a continuation of application Ser. No. 07/879,191, filed May 6, 1992, now abandoned.

This invention is in the field of electronic circuits, and is more particularly directed to digital driver/receiver circuits.

BACKGROUND OF THE INVENTION

Conventional architectures for digital electronic systems, such systems including data processing systems such as computers, as well as control systems, communication systems, and the like, communicate information between integrated circuit components by way of "buses". Buses are transmission lines, generally configured as a metal line on a printed circuit board, but which also may be implemented as a conductive (e.g., metal or doped semiconductor) line within an integrated circuit chip, and to which various circuit functions are connected in such architectures. These circuit functions are capable of driving the bus with digital information, receiving digital information from the bus, or both, such digital information corresponding to data, address values, control signals, and the like.

Where multiple driver circuits are connected to the same bus, the system must be controlled in such a manner to prevent two or more drivers from simultaneously driving the bus with complementary data states for significant periods of time. Conflicting data states on a bus can result in excessive power dissipation, and damage to the driver circuits in the electronic system. Conventional electronic circuits thus generally include drivers which are capable of presenting a high impedance at their outputs, so that the buses connected thereto may be released, and data driven thereupon from another circuit. As is well-known, such drivers are commonly referred to as "tristate" drivers, and the buses referred to in the system context as "tristate" buses.

Referring to FIG. 1, a portion of a conventional electronic system is illustrated relative to a single bus line $BUS_n$. Line $BUS_n$ is but a single data line of a bus; modern buses in data processing systems now include up to as many as thirty-two such lines for the simultaneous communication of a thirty-two bit digital word. Connected to bus line $BUS_n$ are integrated circuit components $2_0$ through $2_3$, each capable of performing an electronic function in communication with bus line $BUS_n$ to which each is connected. Generally, each of integrated circuits 2 will have a terminal connected to each of the lines in the bus; for example, for a sixteen bit bus, integrated circuit $2_0$ would have sixteen terminals, each connected to a different one of the bus lines. Such parallel connection is not shown, for purposes of clarity.

Integrated circuits 2 correspond to different electronic functions, and thus may connect to bus line $BUS_n$ in varying fashion. For example, integrated circuit $2_0$ may be a data processing device such as a microprocessor or a custom integrated circuit (e.g., an application specific integrated circuit, or ASIC) which receives data from bus line $BUS_n$, processes the data according to a program or algorithm, and presents the results back onto bus line $BUS_n$. As such, integrated circuit $2_0$ includes a bidirectional input/output circuit I/O therewithin which both receives and presents data onto bus line $BUS_n$. In contrast, integrated circuit $2_1$ may be a read/write memory, such as a RAM, which is written by data on bus line $BUS_n$ and which, in a read operation, presents data onto bus line $BUS_n$. Integrated circuit $2_1$ thus also has both an input and an output coupled to bus line $BUS_n$, by way of a bidirectional input/output circuit I/O; alternatively, dedicated input and output terminals (and associated receiver and driver circuits, respectively) may be provided in integrated circuit $2_1$. Integrated circuit $2_2$ may be an input device, read-only memory, or a similar function which only presents data to bus line $BUS_n$, and accordingly includes an output circuit Q connected thereto. Conversely, integrated circuit $2_3$ may be an output device, such as a display or printer driver function, and as such receives data from bus line $BUS_n$ via input circuit I.

Other similar architectures are, of course, well known in the art. For example, bus line $BUS_n$ may be a serial bus, in which it would be the only bus line in the bus. In addition, for either a parallel or serial bus, integrated circuits 2 may be individual circuit functions in a VLSI integrated circuit, such as a microprocessor, which is designed according to a bus architecture. In addition, the selection and arrangement of particular circuit functions coupled to a common bus line $BUS_n$ is unlimited.

As noted hereinabove, where bus line $BUS_n$ is a tristate bus line, some type of control is necessary so that no two circuits 2 are simultaneously driving bus line $BUS_n$ with conflicting digital data states, for significant periods of time. A first conventional technique for achieving such control is to ensure, in the operation of the system, that all output drivers coupled to bus line $BUS_n$ are in a high-impedance state before enabling an output driver in any one of circuits 2 to drive the bus. While such a scheme avoids bus contention and conflict, and avoids the dissipation of current which can result from such conflict even for a short period of time, certain problems can arise from this scheme. A first problem is that bus line $BUS_n$, with all drivers in high-impedance, will float to an indeterminate voltage due to coupling of noise through unavoidable parasitic impedances, and to other causes. If the voltage to which bus line $BUS_n$ floats is near the trip point of one or more receivers coupled thereto, significant current can be drawn through the receivers. In addition, false switching of the receivers can occur if bus line $BUS_n$ floats past a receiver trip point. Accordingly, it is generally undesirable to allow a nondriven bus line $BUS_n$ to float to an indeterminate voltage.

Another technique used in the system context of FIG. 1 to prevent both significant bus contention and bus floating is to control integrated circuits 2 in such a manner that driving of the bus overlaps for a brief time. This is accomplished by maintaining one of the output drivers in a circuit 2 in an active state until just immediately after an output driver in another circuit 2 begins to drive the bus; in this way, bus line $BUS_n$ is never left to float. However, during such time as the two drivers are both on, with conflicting data states, the power dissipation can be quite large. Such large power dissipation will of course damage the circuits if maintained for sufficient time, but even for brief pulses can generate system noise, glitches on the power supplies, and indeterminate operation of receivers connected to the bus.

Passive techniques for maintaining the data state of a bus have also been used. Referring now to FIGS. 2a and 2b, two conventional receiver circuits 4a, 4b, are illustrated which include such passive control of the output. Receivers 4a, 4b are each for communicating data from node IOEXT to node IOINT. In this example node IOEXT is for coupling to a bus line, such as bus line $BUS_n$ of FIG. 1, and node IOINT is for coupling to an internal node of the integrated circuit which includes receiver 4a or 4b. Receivers 4a, 4b each include p-channel transistor 6p and n-channel transistor 6n connected in conventional CMOS inverter fashion, having their source-drain paths connected in series between power supply voltage $V_{cc}$ and ground, and having their gates coupled in common to node IOEXT; the output of the inverter is at the common drain node. The common drains of transistors 6 are coupled to the common gates of p-channel transistor 10p and n-channel transistor 10n, also connected in CMOS inverter fashion, and which have their drains connected in common at node IOINT. Receiver 4a, 4b each further include p-channel transistor 8p and n-channel transistor 8n, coupled as a CMOS inverter, with their common gates coupled to node IOINT and their common drains coupled to the gates of transistors 10 and the drains of transistors 6.

In operation, each of receivers 4a, 4b receive a logic state at node IOEXT which it logically inverts twice by way of the inverter of transistors 6 and the inverter of transistors 10, with one of transistors 10p, 10n driving node IOINT with the received logic state. The driven data state is latched at the gates of transistors 10 by the inverter of transistors 8, so that the data state at node IOINT is latched and maintained even if the bus line to which node IOEXT is coupled is later taken to a high impedance state.

Conventional receiver 4a further includes p-channel transistor 12p which is implemented in order to keep system bus lines $BUS_n$, to which node IOEXT is connected, from floating. P-channel transistor 12p has its drain coupled to node IOEXT, and has its source biased to the $V_{cc}$ power supply; the gate of transistor 12p is coupled to ground, so that transistor 12p is always on. In effect, transistor 12p is a pull-up resistor; a transistor having a fixed gate voltage is generally more easily implemented in modern integrated circuit processing than a diffused or polysilicon resistor. As a result, if bus line $BUS_n$ to which node IOEXT in receiver 4a does not have a logic state driven thereon by an output driver circuit, transistor 12p will pull node IOEXT and bus line $BUS_n$ toward $V_{cc}$. The pull-up function of transistor 12p thus keeps bus line $BUS_n$ away from indeterminate levels near the trip point of receivers (including receiver 4a), and avoids the floating bus problems noted hereinabove.

Receiver 4b in FIG. 2b conversely includes transistor 12n, which is an n-channel transistor having its drain coupled to node IOEXT, its source connected to ground, and its gate coupled to $V_{cc}$ so that transistor 12n is always on. Transistor 12n thus serves as a pull-down device, and will pull node IOEXT and bus line $BUS_n$ to which it is connected to ground, similarly keeping bus line $BUS_n$ from floating to a level near the trip point of a receiver such as receiver 4b.

In either case, pull-up transistor 12p, pull-down transistor 12n, or resistors similarly connected, each keep bus lines $BUS_n$ from floating to undesired metastable voltages. However, during such time as an output driver is driving the bus line $BUS_n$ to the data state opposite from that to which the transistor 12 (or resistor) is pulling the line, DC current will be drawn and power will be dissipated. While the characteristics of transistors 12 can be selected by way of layout to reduce the power dissipation, DC power is still necessarily drawn for such opposing data states. In addition, transistors 12 add load to the output driver circuits, reducing system performance and requiring additional drive capability for such circuits.

Alternative pull-up and pull-down schemes for keeping bus lines $BUS_n$ from floating include the use of pull-up or pull-down devices in combination with open-drain (or open-collector) output driver circuits; similarly as noted hereinabove, an opposing data state will cause DC current to be drawn through the pull-up or pull-down device. Yet another scheme uses both a pull-up and a pull-down device to keep bus line $BUS_n$ at a selected voltage near a receiver trip point to reduce the DC current when the bus is driven, but far enough away from the trip point to avoid false switching when the bus is in tristate. While the DC current is reduced by this arrangement, such current is drawn regardless of the data state driven on the bus line, as either the pull-up or the pull-down device is opposed by the driven data state.

In recent years, battery powered electronic systems have become more desirable and achievable, particularly with the advent of high speed CMOS technology. Examples of such battery powered systems include laptop or notebook-sized personal computers, as well as portable digital instrumentation, and portable digital entertainment systems (e.g., CD players). In order for battery life to be acceptable to the user of such systems, DC current drawn by the system must be minimized. The bus control schemes noted hereinabove which incorporate pull-up or pull-down devices each achieve such control at the expense of DC power dissipation. Such power dissipation, particularly as more functions are coupled to a given bus, may not be tolerable in a battery powered system.

It is therefore an object of this invention to provide a receiver circuit which includes keeper circuitry for controlling a tristate bus line in the high impedance state, at very lower power dissipation levels.

It is a further object of this invention to provide such a receiver circuit which can be readily implemented by conventional fabrication technology.

It is a further object of this invention to provide such a receiver circuit which is suitable for use in a bidirectional I/O cell for an application specific integrated circuit.

It is a further object of this invention to provide such a receiver circuit which can be used for interchip or intrachip bus control.

Other objects and advantages of the present invention will be apparent to those of ordinary skill in the art having reference to the following specification together with the drawings.

SUMMARY OF THE INVENTION

The invention may be incorporated into a receiver circuit by providing a weak, gated, pull-up transistor and a weak, gated, pull-down transistor. The pull-up and pull-down transistors have their gates connected in common, and their drains coupled to the external terminal, which in turn is connected to the tristate bus line to be controlled. The gates of the weak pull-up and pull-down transistors are coupled to a node in the receiver which is logically inverted from the external terminal, so that the weak pull-up and pull-down transistors serve to weakly latch the bus line in the absence of an output driver on the bus which otherwise is driving the bus to a logic level. The pull-up and pull-down transistors are sufficiently weak that as to be easily overdriven by a conventional output driver on the bus. Once driven by an output driver, the one of the pull-up or pull-down transistors which opposes the driven data state turns off, so that no DC power is drawn therethrough once the bus line data state is set.

DETAILED DESCRIPTION OF THE PREFERRED EMBODIMENT

Figure 3:
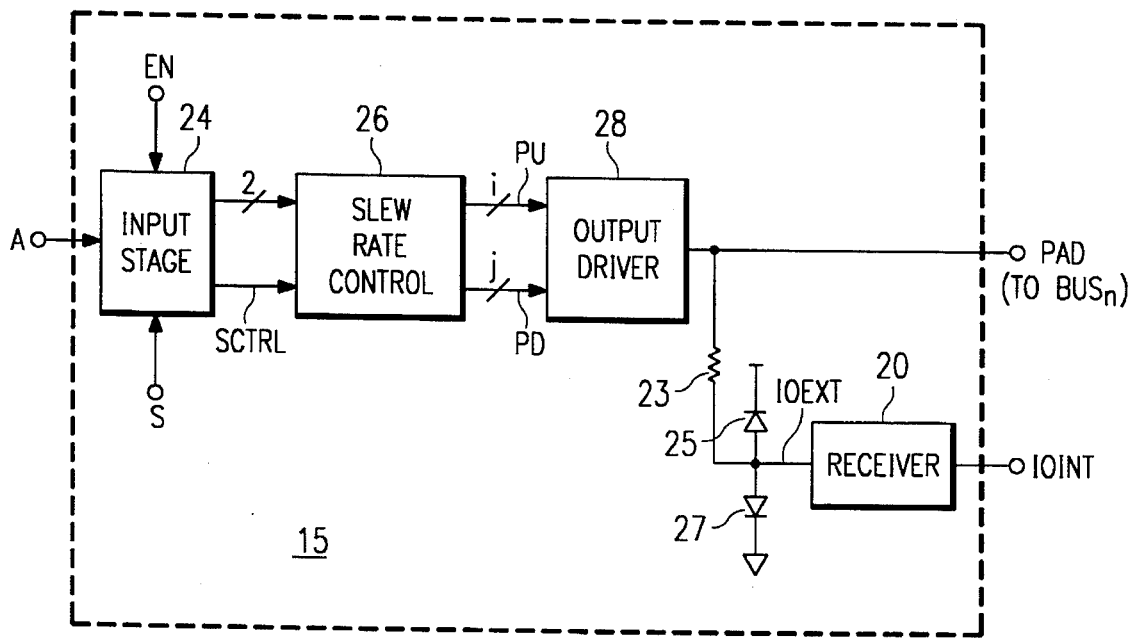
FIG. 3 is an electrical diagram, in block form, of a bidirectional driver/receiver circuit incorporating a receiver according to the invention.

Referring now to FIG. 3, bidirectional input/output buffer 15, into which receiver 20 according to the preferred embodiment of the invention may be incorporated, will now be described in detail. Buffer 15, in this example, is a cell designed for implementation into an application specific integrated circuit ("ASIC"), or for modular implementation into a general purpose integrated circuit such as a microprocessor, memory device or the like. Accordingly, multiple ones of buffers 15 may be implemented into a single integrated circuit, depending upon the number of bus connections to be made.

It should be noted that receiver 20, while particularly useful when implemented into bidirectional input/output circuit 15 as will now be described, is useful in and may be incorporated into other circuit arrangements, such arrangements including input buffers and circuits connectable to external buses, and functions within an integrated circuit device having an internal bus architecture.

Figure 1:
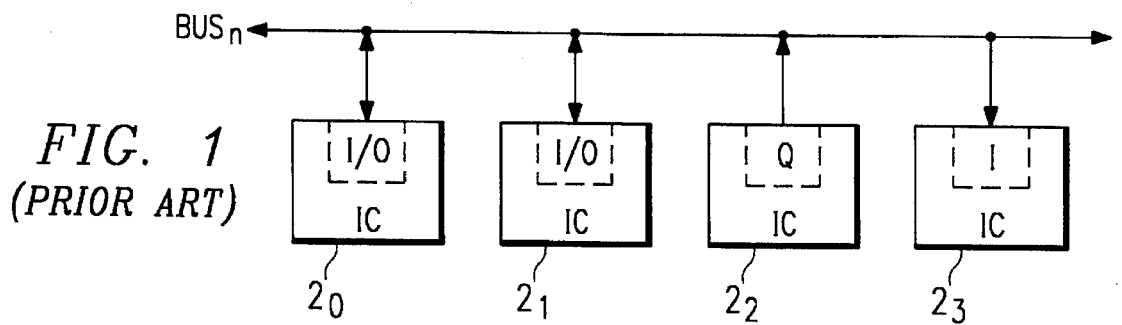
FIG. 1 is an electrical diagram, in block form, of a conventional electronic system implemented in a bus-based architecture.
Figure 2A:
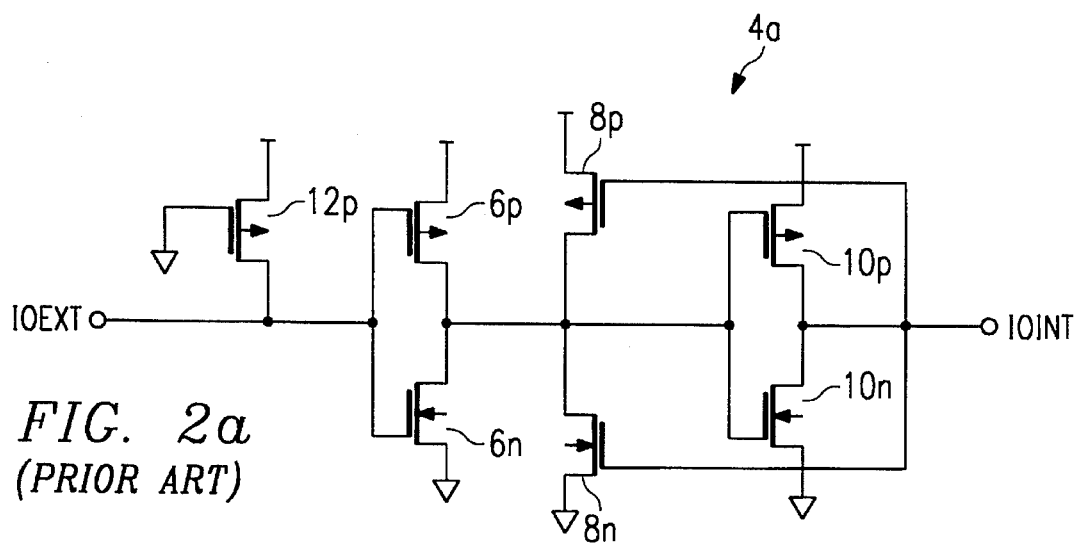
FIGS. 2a and 2b are electrical diagrams, in schematic form, of conventional receivers including bus control devices.
Figure 2B:
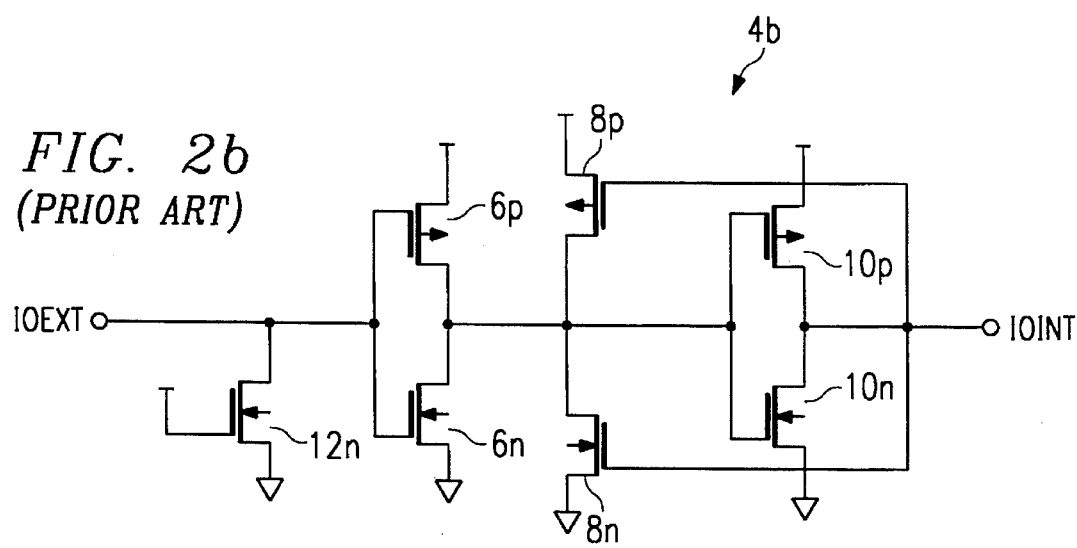

Buffer 15, being bidirectional, includes both output driver circuitry and input receiver circuitry. On the output driver side, buffer 15 includes a conventional input stage 24 which is coupled to terminal A; terminal A is preferably a node internal to the integrated circuit which includes buffer 15, from which buffer 15 is to communicate data to its external terminal PAD. Terminal PAD is adapted to be coupled to a line of a system bus, such as bus line $BUS_n$ of FIG. 1. Input stage 24 receives input data from terminal A, and also receives an enable input from terminal EN, which is also an internal node within the integrated circuit; terminal EN indicates whether the output driver capability is to be enabled, or is to be placed into a high-impedance state. Input stage 24 presents complementary signals corresponding to the data state at terminal A when enabled, and presents signals corresponding to a high impedance state when not enabled by the signal at terminal EN, each in the conventional manner. For example, if the output driver of buffer 15 is of the active push-pull type, in the disabled condition, input stage 24 will present signals which turn off both the pull-up and the pull-down devices.

The complementary output of input stage 24 is communicated to a conventional slew rate control block 26, which also receives a control signal SCTRL generated by input stage 24 responsive to a control signal at terminal S. Slew rate control block 26 generates multiple push-pull control signals for application to output buffer transistors, in such a manner as to optimize switching speed of buffer 15 relative to power dissipation and noise. This function, and slew rate control block 26, are conventional in the art, such as implemented in ASIC cell BD4TR for ASICs manufactured and sold by SGS-Thomson Microelectronics, Inc. The output of slew rate control block include i lines PU and j lines PD, each of which are communicated to output driver 28.

Figure 6:
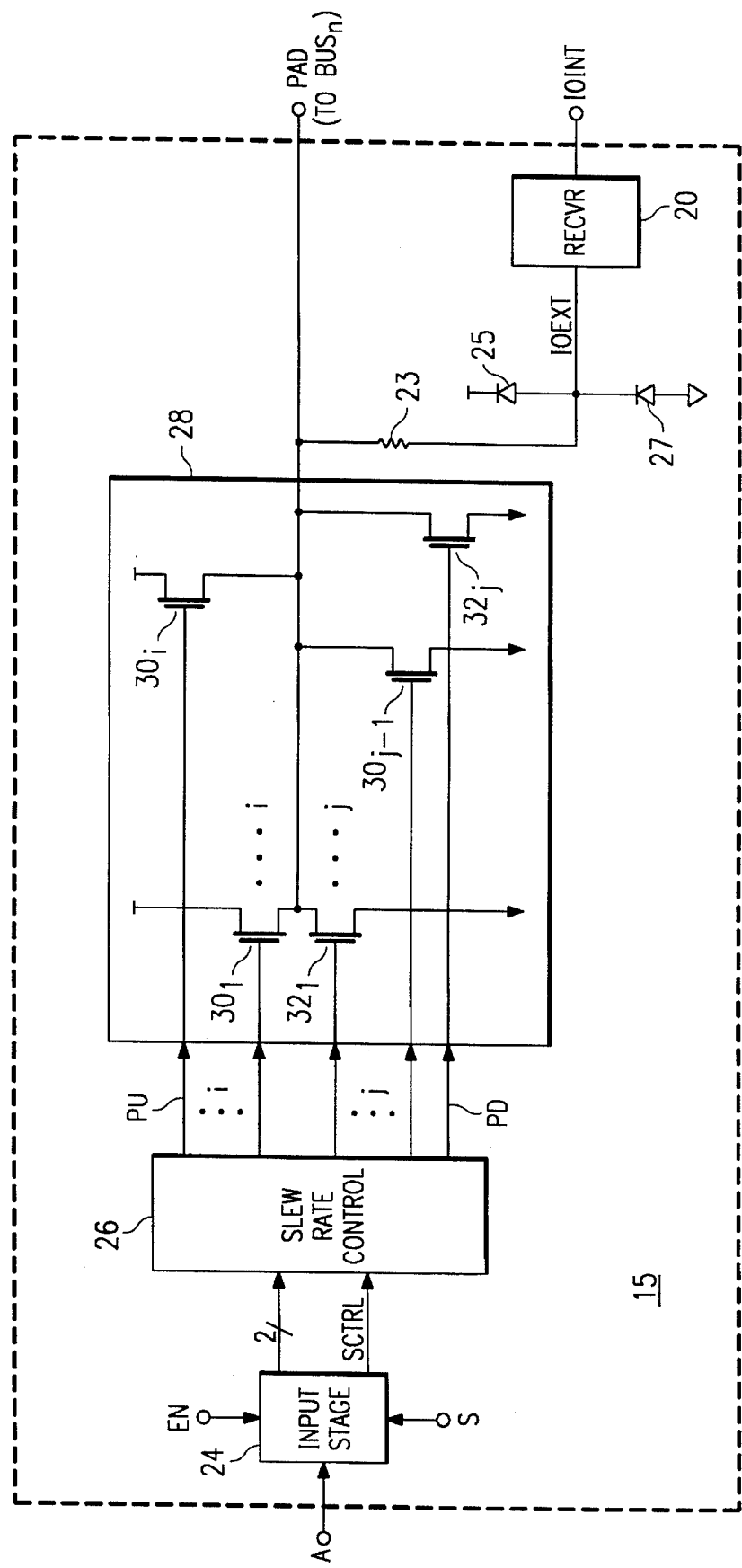
FIG. 6 is an electrical diagram, of a bidirectional driver/receiver circuit of FIG. 3, showing the driver in schematic form

Referring now to FIGS. 3 and 6 simultaneously, output driver 28 is preferably of the conventional push-pull type. In order to provide large drive current of the desired output wave shape, output driver 28 includes i pull-up transistors, $30_1$ through $30_i$ (or sets of parallel pull-up transistors), each receiving one of the i lines PU from slew rate control block 26, and j pull-down transistors, $32_1$ through $32_j$, each receiving one of the j lines PD from slew rate control block 26. When the output driver side of buffer 15 is enabled by the signal at terminal EN, either lines PU or lines PD are placed in their active state, depending upon the data state to be driven, with the timing among the i lines PU or j lines PD, as the case may be, depending upon the particular output wave shape desired. The output of the push-pull output driver 28 is presented at terminal PAD, for communication onto the line of the system bus connected thereto (e.g., bus line $BUS_n$).

On the receiver side of buffer 15, terminal PAD is coupled to line IOEXT via series resistor 23, with diodes 25 and 27 connected thereto. Series resistor 23 and diodes 25, 27 are provided for electrostatic discharge protection of receiver 20, in the conventional manner, and as such have no active function in the receiver side of buffer 15. Line IOEXT is received at the input of receiver 20; receiver 20 presents an output at terminal IOINT to an internal node of the integrated circuit incorporating buffer 15, in similar fashion as described above for conventional buffers 4a, 4b.

In operation, when the output driver side of buffer 15 is enabled by a signal at terminal EN, the data state driven by output driver 28 is presented at external terminal PAD to a line of the system bus, and also onto line IOEXT to receiver 20, for communication back into the integrated circuit. When the output driver side of buffer 15 is not enabled by the signal at terminal EN so that the output of output driver 28 is in a high impedance state, the logic state of bus line $BUS_n$ is received by receiver 20 and communicated to terminal IOINT in the conventional manner.

Figure 4:
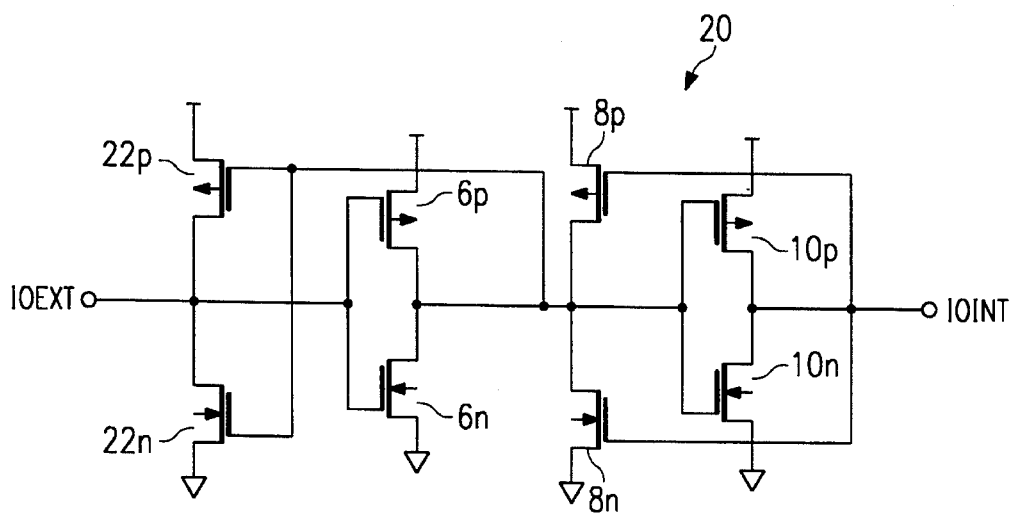
FIG. 4 is an electrical diagram, in schematic form, of a receiver according to the preferred embodiment of the invention.

Referring now to FIG. 4, the construction of receiver 20 according to the preferred embodiment of the invention will now be described in detail, particularly relative to its operation in the case where the bus line $BUS_n$ is in a high impedance condition. Those elements of receiver 20 which are the same as those in conventional receivers 4a, 4b described hereinabove have the same reference numerals, for convenience.

As in the case of the conventional receivers described hereinabove, receiver 20 includes a first CMOS inverter of transistors 6p, 6n with their gates coupled in common to node IOEXT. The drains of transistors 6p, 6n are coupled in common to the gates of transistors 10p, 10n, which are also in a CMOS inverter configuration and which have their drains coupled in common to node IOINT. Latching of the data state driven by transistors 10p, 10n onto node IOINT is maintained by transistors 8p, 8n, having their gates coupled in common to node IOINT and their drains coupled in common to the gates of transistors 10p, 10n.

For purposes of performing the buskeeping function, receiver 20 according to this embodiment of the invention includes another CMOS inverter, configured of p-channel transistor 22p and n-channel transistor 22n. Transistors 22p, 22n are each constructed to have poor drive characteristics, and also relatively high source/drain resistance in the "on" state, as compared with the other transistors 6, 8, 10 in receiver 20, and also as compared with transistors in conventional output drivers such as output driver 28. For example, n-channel transistors 6n and 10n may have channel lengths on the order of 0.8μ and channel widths on the order of 50 to 150μ, and p-channel transistors 6p, 10p may have channel lengths on the order of 0.8μ and channel widths on the order of 75 to 150μ, so that the switching of node IOINT responsive to a change in state at terminal IOEXT is rapid. Latch transistors 8p, 8n will generally have the same channel length as transistors 6, 10, but with reduced channel width so that the latching function will occur but readily be overcome; for example, the channel width of transistor 8p may be on the order of 30μ and the channel width of transistor 8n may be on the order of 25μ.

P-channel transistor 22p in the bus keeper portion of receiver 20 will have a significantly lower W/L ratio than the other p-channel transistors in the drive and latching functions of receiver 20. For example, p-channel transistor 22p may have a channel length of on the order of 6μ and a channel width of on the order of 3.4μ; as a result, the W/L ratio of transistor 22p is on the order of 0.56, while that of p-channel transistors 6p, 8p, 10p ranges from on the order of 25 to on the order of 200. Similarly, n-channel transistor 22n also has a significantly lower W/L ratio. For example, transistor 22n may have a channel length on the order of 5μ and a channel width on the order of 2μ, resulting in a W/L of on the order of 0.4, while the W/L ratios of transistors 6n, 8n, 10n range from on the order of 30 to on the order of 200.

The relative drive capability of transistors 22n, 22p is contemplated to be even weaker compared to that of typical output drivers. By way of example, a typical output driver 28, such as in the ASIC cell BD4TR for ASICs manufactured and sold by SGS-Thomson Microelectronics, Inc. includes two groups of commonly controlled n-channel pull-up transistors in parallel (i.e., i=2 in FIG. 3) and eight individually controlled n-channel pull-down transistors in parallel (i.e., j=8 in FIG. 3), each transistor having a W/L ratio on the order of 100 or greater. The drive of transistors 22 is thus substantially weaker than that of even a single transistor in a typical output driver, much less eight transistors in parallel. As will be noted hereinbelow, this allows for a typical output driver to easily switch the state of node IOEXT, even if several receivers 20 are coupled thereto.

In addition, due to the long channel lengths of transistors 22p, 22n, their source/drain resistance when on is quite significant; for example, the "on" resistance of transistors 22p, 22n constructed as described above will be on the order of 25 to 50 kΩ

For compatibility of fabrication, the above-described construction of transistors 22p, 22n with long channel lengths and low W/L ratios is preferred. According to this construction, the weak drive capability and high source/drain "on" resistance is obtained merely by way of layout of the transistors, with all other features (e.g., source/drain doping, threshold adjust implant, etc.) remaining the same. Alternatively, the same effect of weak drive and high "on" resistance may be achieved according to the present invention by fabricating transistors 22 with similar channel length and W/L characteristics as the other transistors in receiver 20, but by also including a series resistor (diffusion or polysilicon) in series with the source/drain path of each transistor 22, between node IOEXT and the respective bias voltage. It is contemplated that other alternatives will now be apparent to those of ordinary skill in the art having reference to this specification.

Figure 5:
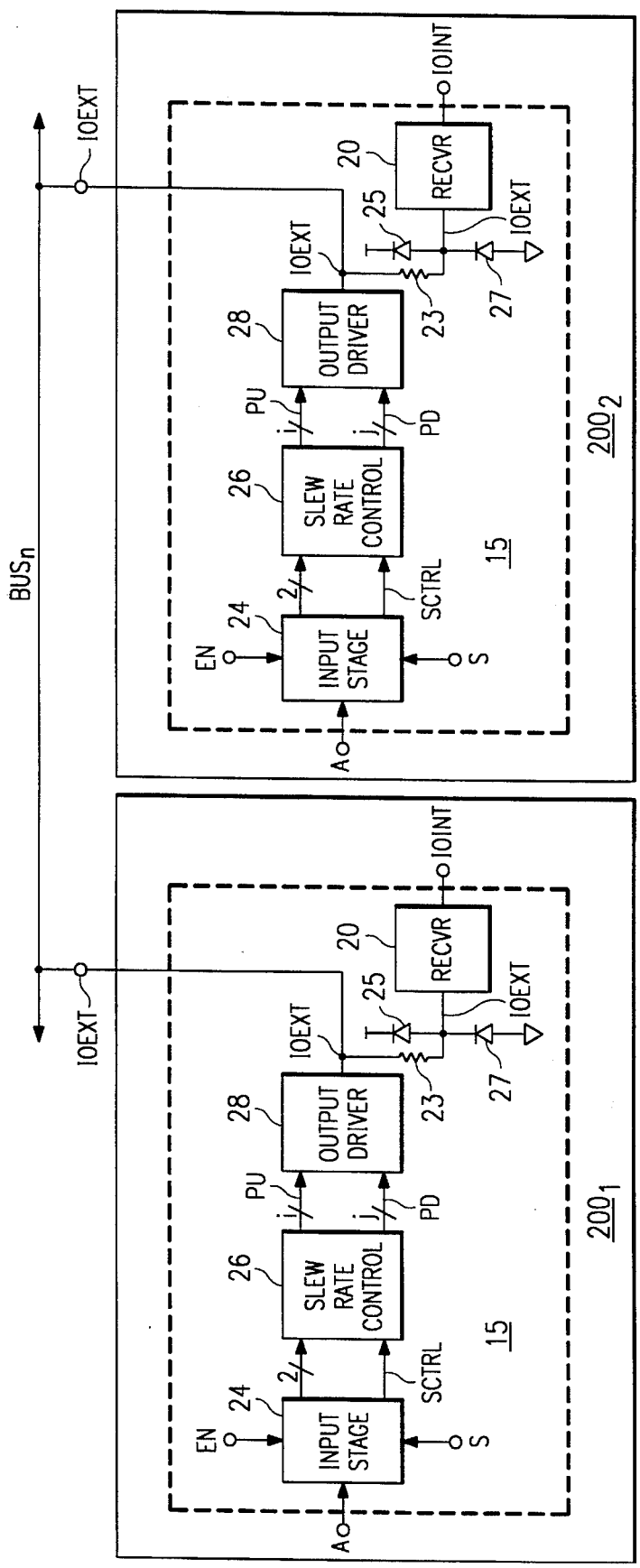
FIG. 5 is an electrical diagram, in block form, of a system incorporating integrated circuits according to the preferred embodiment of the invention.

The operation of receiver 20 when implemented into an integrated circuit 200₂ according to the preferred embodiment of the invention will now be described in detail, relative to FIG. 4 in combination with FIG. 5, beginning with the state in which node IOEXT is driven to a data state by output driver 28 in buffer 15 of integrated circuit 200₂, or by a similar push-pull output driver 28 in another integrated circuit 200₁ also coupled to bus line BUS$_n$. When node IOEXT is driven, transistors 22p, 22n will reinforce the driven data state. For example, if node IOEXT is driven to a high logic level by push-pull output driver 28 of integrated circuit 200₁, in receiver 20 of integrated circuit 200₂, transistor 6n will be turned on and transistor 6p off, pulling the drains of transistors 6p, 6n to ground. This low level at the drains of transistors 6 will, in turn, turn transistor 22p on and transistor 22n off, so that the drains of transistors 22 are pulled to $V_{cc}$, reinforcing the externally driven high logic level at node IOEXT. Similarly, if node IOEXT is driven low by output driver 28 of integrated circuit 200₂ or another output driver 28 for another integrated circuit 200₁ on bus line BUS$_n$, transistors 6p and 22n in receiver 20 of integrated circuit 200₂ will be on, and transistors 6n and 22p off, reinforcing the low logic level at node IOEXT.

In either case, a driven state at node IOEXT of receiver 20 will cause the opposing transistor 22 to be turned off, and the reinforcing transistor 22 to be turned on. Accordingly, no DC current is drawn through either transistor 22 when bus line BUS$_n$ is driven to either logic state.

Bus line BUS$_n$ is released at such time as all output drivers, including the one previously driving bus line BUS$_n$, are placed in a high impedance state. This will cause node IOEXT at receiver 20 to no longer be externally driven, but the latch configuration of transistors 6, 22 maintains the previous data state at node IOEXT. For example, if node IOEXT is driven to a high logic level by output driver 20 of integrated circuit 200₁ and then released, transistors 6n and 22p in receiver 20 of integrated circuit 200₂ will remain on, and transistors 6p and 22n will remain off, until such time as IOEXT is driven to an opposing low logic level. Conversely, the latch of transistors 6, 22 will maintain a low logic level at node IOEXT after it has been driven low and then released.

This "keeping" operation of transistors 22 which maintains node IOEXT, and thus bus line BUS$_n$, at its previously driven logic level, requires very little DC current due to the CMOS latch configuration of transistors 6, 22. In addition, since the same one of transistors 22 remains on after bus line BUS$_n$ is released, no switching power is required in order to perform the keeping function. As a result, the DC current drawn by receiver 20 in maintaining the state of node IOEXT and bus line BUS$_n$ connected thereto is merely the source/drain leakage current through the "off" transistors, such leakage being extremely low for modern MOS transistors.

Bus line BUS$_n$ will, of course, generally be driven to a logic level at some point in time after being in its tristate condition. The driving of bus line BUS$_n$ may be by a different output driver, or by the same output driver, as was most recently enabled. If the next driven level is the same as the prior level, the state of transistors 6, 22 will, of course, remain the same, with little power dissipation resulting.

In the event that the next driven level is the opposite state from that maintained at node IOEXT, the output driver driving bus line BUS$_n$ must overcome the drive of the one of the transistors 22 which is on, in order to communicate the new data. As noted hereinabove, however, the drive capability of transistors 22 is relatively weak; it is therefore contemplated that typical output driver circuitry can readily switch the states of transistors 22, via transistors 6, without significant degradation of switching performance, even if several receivers 20 are all connected to the same bus line $BUS_n$. In addition, as noted hereinabove, the source/drain resistance of transistors 22 in the "on" state is relatively high, for example on the order of 25 to 50 kΩ. As a result, the power dissipated in the switching of transistors 22 to the next data state is relatively small.

The present invention thus provides significant advantages over the prior art. Receivers constructed according to the invention keep tristatable bus lines from floating by maintaining the bus lines at the last driven level. This function is obtained in a manner which requires extremely low DC current, such current being only the source/drain leakage of a MOS transistor in its "off" state. The keeping function is also provided by devices with relatively weak drive, so that the assertion of an opposite data state after tristate of the bus line can be done by typical output drivers, with insignificant performance degradation. The present invention thus provides for system bus control in a manner which is particularly beneficial in low power systems such as those powered by batteries, and in a manner which is compatible with conventional integrated circuit fabrication techniques.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A receiver circuit, comprising:

an input node, for direct connecting to a tristate bus line;

an output node;

an inverter, having an input directly connected to said input node and having an output coupled to said output node:

a first transistor, having a conduction path directly connected on one side to said input node and coupled on another side to a first bias voltage, and having a control terminal; and a second transistor, having a conduction path directly connected on one, side to said input node and coupled on another side to a second bias voltage, and having a control terminal;

wherein the control terminals of said first and second transistors are coupled to the output of said inverter in such a manner that said first transistor is on and said second transistor is off responsive to the logic level at said input node corresponding to said first bias voltage and in such a manner that said second transistor is on and said first transistor is off responsive to the logic level at said input node corresponding to second bias voltage;

and wherein said first and second transistors have drive characteristics which are significantly weaker than said inverter.

2. The receiver of claim 1, wherein said first and second transistors are field effect transistors.

3. The receiver of claim 2, wherein said first and second transistors are of first and second conductivity type, respectively, and have their control terminals connected in common to the output of said inverter.

4. The receiver of claim 3, wherein said inverter comprises first and second inverter transistors of the field effect type, having their source/drain paths connected in series between said first and second bias voltages, having their gates coupled in common to said input node, and having their drains coupled to said output node.

5. The receiver of claim 4, wherein the width/length ratio of said first transistor is significantly smaller than the width/length ratio of said first inverter transistor;

and wherein the width/length ratio of said second transistor is significantly smaller than the width/length ratio of said second inverter transistor.

6. The receiver of claim 4, wherein the source/drain on resistance of said first transistor is significantly greater than that of said first inverter transistor;

and wherein the source/drain on resistance of said second transistor is significantly greater than that of said second inverter transistor.

7. An electronic system, comprising:

a bus line;

a driver circuit, for selectively driving said bus line to a first logic state or a second logic state, said driver circuit also having a high impedance output state; and a receiver, having an output node, comprising:

an inverter, having an input directly connected to said bus line and having an output coupled to said output node;

a first transistor, having a conduction path directly connected on one side to said bus line and coupled on another side to a first bias voltage, and having a control terminal; and a second transistor, having a conduction path directly connected on one side to said bus line and coupled on another side to a second bias voltage, and having a control terminal;

wherein said first and second bias voltages correspond to said first and second logic states, respectively;

wherein the control terminals of said first and second transistors are coupled to the output of said inverter in such a manner that said first transistor is on and said second transistor is off responsive to said first logic state and said bus line, and in such a manner that said second transistor is on and said first transistor is off responsive to said second logic state at said bus line;

and wherein said first and second transistors have drive characteristics which are significantly weaker than said driver circuit.

8. The system of claim 7, wherein said first and second transistors are field effect transistors.

9. The system of claim 8, wherein said first and second transistors are of first and second conductivity type, respectively, and have their control terminals connected in common to the output of said inverter.

10. The system of claim 9, wherein said inverter comprises first and second inverter transistors of the field effect type, having their source/drain paths connected in series between said first and second bias voltages, having their gates coupled in common to said bus line, and having their drains coupled to said output node;

wherein the source/drain on resistance of said first transistor is significantly greater than that of said first inverter transistor;

and wherein the source/drain on resistance of said second transistor is significantly greater than that of said second inverter transistor.

11. An electronic system, comprising:
a bus line;
a driver circuit, for selectively driving said bus line to a first logic state or a second logic state, said driver circuit also having a high impedance output state; and
a receiver, having an output node, comprising:
an inverter, having an input directly connected to said bus line ant having an output coupled to said output node;
a first transistor, having a conduction path directly connected on one side to said bus line and coupled on another side to a first bias voltage, and having a control terminal; and
a second transistor, having a conduction path directly connected on one side to said bus line and coupled on another side to a second bias voltage, and having a control terminal;
wherein said first and second bias voltages correspond to said first and second logic states, respectively;
wherein the control terminals of said first and second transistors are coupled to the output of said inverter in such a manner that said first transistor is on and said second transistor is off responsive to said first logic state and said bus line, and in such a manner that said second transistor is on and said first transistor is off responsive to said second logic state at said bus line;
wherein said first and second transistors have drive characteristics which are significantly weaker than said driver circuit;
wherein said first and second transistors are field effect transistors;
wherein said first and second transistors are of first and second conductivity type, respectively, and have their control terminals connected in common to the output of said inverter; and,
wherein said driver circuit is of the push-pull type.

12. The system of claim 11, wherein said driver circuit comprises:
a pull-up transistor of the field effect type; and
a pull-down transistor of the field effect type;
wherein the width/length ratio of said first transistor is significantly smaller than the width/length ratio of said pull-up transistor;
and wherein the width/length ratio of said second transistor is significantly smaller than the width/length ratio of said pull-down transistor.

13. The system of claim 7, wherein said driver circuit and said receiver are disposed on the same integrated circuit.

14. The system of claim 13, wherein said bus line is disposed on the same integrated circuit as said driver circuit and receiver.

15. A method of controlling a bus line to which a first tristate output driver and a receiver are coupled, comprising:
first driving said bus line to a selected one of first and second logic levels with said first output driver;
after said first driving step, keeping said bus line at the logic level to which it is driven in said driving step by:
responsive to said first driving step driving said bus line to said first logic level, turning on a first transistor coupled between said bus line and a first bias voltage corresponding to said first logic level so as to bias said bus line toward said first bias voltage; and
responsive to said first driving step driving said bus line to said second logic level, turning on a second transistor coupled between said bus line and a second bias voltage corresponding to said second logic level so as to bias said bus line toward said second bias voltage;
placing said first output driver in a high impedance state after said keeping step;
after said placing step, maintaining the on state of said first or second transistor turned on in said keeping step;
wherein said first and second transistors have significantly weaker drive characteristics than said first output driver.

16. The method of claim 15, further comprising:
after said maintaining step, driving said bus line to the opposite logic level from that driven in said first driving step.

17. The method of claim 15, wherein said first and second transistors are of the field effect type, and have opposite conductivity type from one another.

18. The method of claim 15, further comprising:
after said maintaining step, driving said bus line with a second output driver coupled thereto, said first output driver remaining in said high impedance state.

19. A receiver circuit, comprising:
an input node, for coupling to a tristate bus line;
a receiver output node;
a first inverter, having an input coupled to said input node and having an output coupled to said output node;
a first transistor, having a conduction path coupled on one side to said input node and coupled on another side to a first bias voltage, and having a control terminal;
a second transistor, having a conduction path coupled on one side to said input node and coupled on another side to a second bias voltage, and having a control terminal;
a latch comprising a first latch transistor and a second latch transistor, having their source/drain paths connected in series between said first and second bias voltages having their gates coupled in common to said receiver output node, and having their drains coupled to said first inverter; and,
a second inverter having an input coupled to an output of said latch, and an output coupled to said receiver output node;
wherein the control terminals of said first and second transistors are coupled to the output of said inverter in such a manner that said first transistor is on and said second transistor is off responsive to the logic level at said input node corresponding to said first bias voltage, and in such a manner that said second transistor is on and said first transistor is off responsive to the logic level at said input node corresponding to said second bias voltage;
and wherein said first and second transistors have drive characteristics which are significantly weaker than said inverter.

20. The receiver of claim 19, wherein:
the width/length ratio of said first latch transistor is larger than the width length ratio of said first transistor and is smaller than the width/length ratio of said first inverter transistor; and
the width/length ratio of said second latch transistor is larger than the width length ratio of said second transistor and is smaller than the width/length ratio of said second inverter transistor.

* * * * *

UNITED STATES PATENT AND TRADEMARK OFFICE

CERTIFICATE OF CORRECTION

PATENT NO.   :   5,532,630

DATED        :   July 2, 1996

INVENTOR(S)  :   Charles D. Waggoner; Richard J. Blumberg; Gary B. Kotzur

It is certified that error appears in the above-identified patent and that said Letters Patent is hereby corrected as shown below:

In Column 12, Claim 19, line 25, change "a receiver" to --an--.

In Column 12, Claim 19, line 38, change "said" to --a--.

Signed and Sealed this

Twenty-second Day of October, 1996

Attest:

BRUCE LEHMAN

*Attesting Officer*   *Commissioner of Patents and Trademarks*

UNITED STATES PATENT AND TRADEMARK OFFICE

CERTIFICATE OF CORRECTION

PATENT NO.    :   5,532,630

DATED         :   July 2, 1996

INVENTOR(S)   :   Charles D. Waggoner; Richard J. Blumberg; and Gary B. Kotzur

It is certified that error appears in the above-identified patent and that said Letters Patent is hereby corrected as shown below:

On the title page:

In Item [73] Assignee, add --Compaq Computer Corporation, Houston, Texas--.

Signed and Sealed this

Twelfth Day of November, 1996

Attest:

BRUCE LEHMAN

*Attesting Officer*    *Commissioner of Patents and Trademarks*